US010028367B2

(12) United States Patent
Brandstätter et al.

(10) Patent No.: US 10,028,367 B2
(45) Date of Patent: Jul. 17, 2018

(54) DEVICE AND METHOD FOR GENERATING UV OR X-RAY RADIATION BY MEANS OF A PLASMA

(71) Applicant: ETH Zürich, Zürich (CH)

(72) Inventors: Markus Brandstätter, Zürich (AT); Reza Abhari, Forch (CH); Bob Rollinger, San Diego, CA (US)

(73) Assignee: ETH ZÜRICH, Zürich (CH)

( * ) Notice: Subject to any disclaimer, the term of this patent is extended or adjusted under 35 U.S.C. 154(b) by 0 days.

(21) Appl. No.: 15/692,000

(22) Filed: Aug. 31, 2017

(65) Prior Publication Data

US 2018/0084630 A1 Mar. 22, 2018

(30) Foreign Application Priority Data

Sep. 2, 2016 (EP) .................................... 16187104

(51) Int. Cl.
*H05G 2/00* (2006.01)
*G03F 7/20* (2006.01)
*H01S 3/105* (2006.01)

(52) U.S. Cl.
CPC ............ *H05G 2/008* (2013.01); *H05G 2/003* (2013.01)

(58) Field of Classification Search
CPC ........ H05G 2/003; H05G 2/008; H05G 2/005; H05G 2/006; H05G 2/001; G03F 7/7003; G03F 7/70916; G03F 7/70175; G03F 7/70166; G03F 7/70808; G03F 7/70841; G03F 7/70908; G03F 7/70933; G03F 7/20; G03F 7/70058; G03F 7/70858; G03F 7/70983; H01S 3/005; H01S 3/0064; H01S 3/2316; H01S 3/2232; H01S 3/073; H01S 3/0805; H01S 3/08054; H01S 3/08059; H01S 3/083; H01S 3/10092; H01S 3/105; H01S 3/1066; H01S 3/115; H01S 3/121; H01S 3/127; H01S 3/2325; H01S 3/2383
USPC ...... 250/504 R, 492.22, 493.1, 496.1, 503.1; 378/119, 121
See application file for complete search history.

(56) References Cited

U.S. PATENT DOCUMENTS

| | | | | |
|---|---|---|---|---|
| 6,507,641 | B1 * | 1/2003 | Kondo | G03F 7/70033 378/119 |
| 9,364,831 | B2 * | 6/2016 | Chiou | B01L 3/502738 |
| 9,591,734 | B1 * | 3/2017 | Masic | H05G 2/008 |
| 9,667,019 | B2 * | 5/2017 | Moriya | H01S 3/0064 |
| 9,883,574 | B2 * | 1/2018 | Iwamoto | H05G 2/006 |
| 9,922,811 | B2 * | 3/2018 | Gunther | H01J 49/105 |

(Continued)

FOREIGN PATENT DOCUMENTS

WO WO 2009024860 2/2009

*Primary Examiner* — David A Vanore
(74) *Attorney, Agent, or Firm* — Soroker Agmon Nordman

(57) ABSTRACT

The invention relates to a device (100) for generating UV or X-ray radiation (R) by means of a plasma (10), comprising a first compartment (110), a dispensing device (5), which is adapted to provide a target material (80) in the first compartment (10), an excitation light source (13) for providing an excitation light beam (90), and a buffer gas inlet (130) and/or a buffer gas outlet (140) for providing a buffer gas flow (B) along the direction (D) of the excitation light beam (90) in the first compartment (110), wherein the first compartment (110) is adapted to be at least partially heated by a heating device (150).
The invention further relates to a method for generating UV or X-ray radiation (R) by means of the device (100).

15 Claims, 3 Drawing Sheets

(56) References Cited

U.S. PATENT DOCUMENTS

Figure 1:
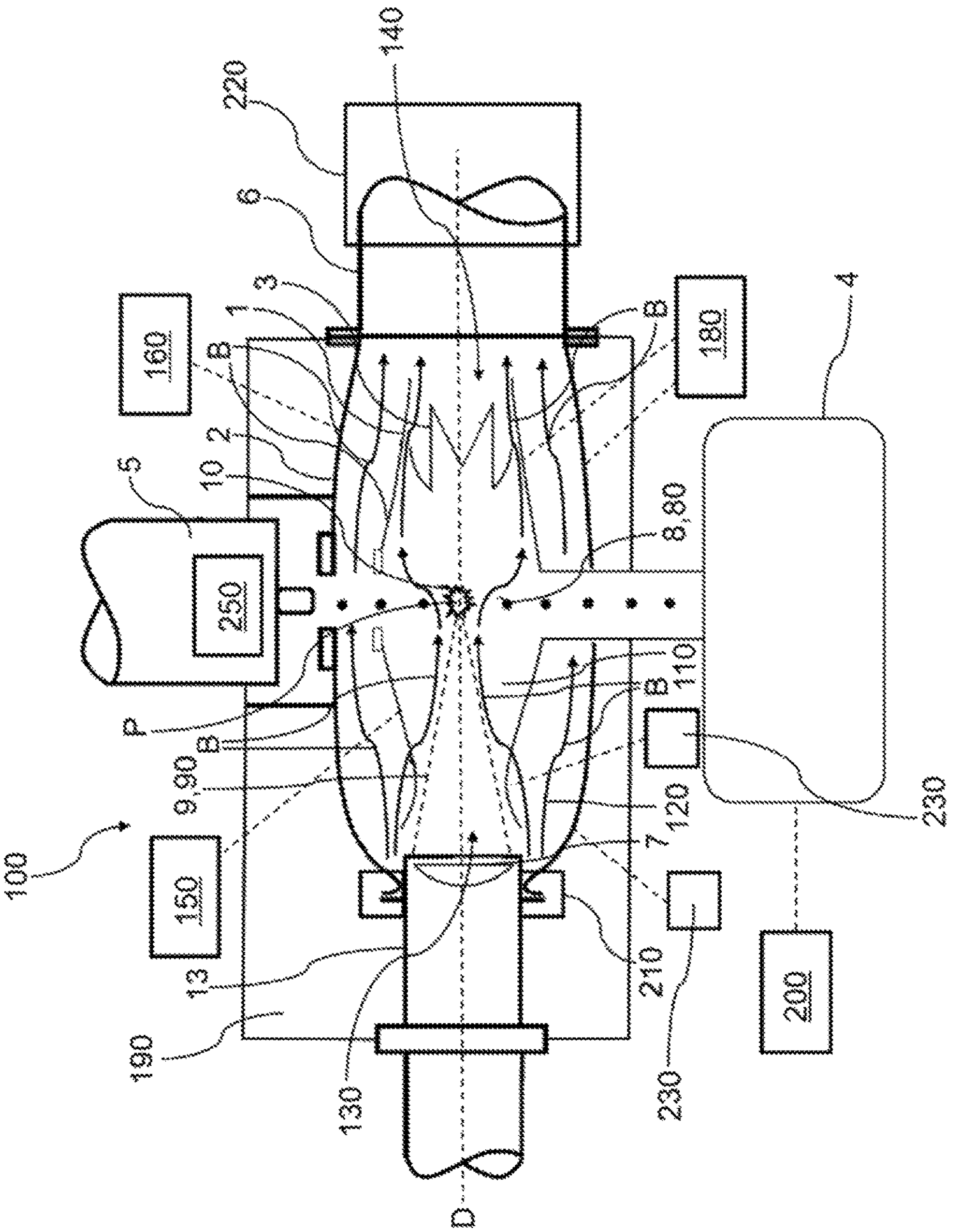

| | | | | |
|---|---|---|---|---|
| 2003/0223542 | A1* | 12/2003 | Shields | H05G 2/003 378/119 |
| 2007/0102653 | A1* | 5/2007 | Bowering | H05G 2/003 250/504 R |
| 2008/0023657 | A1* | 1/2008 | Melnychuk | B82Y 10/00 250/504 R |
| 2008/0048134 | A1* | 2/2008 | Shirai | H05G 2/003 250/504 R |
| 2008/0087847 | A1* | 4/2008 | Bykanov | H05G 2/003 250/504 R |
| 2008/0142741 | A1* | 6/2008 | Van Herpen | B82Y 10/00 250/492.22 |
| 2008/0237498 | A1* | 10/2008 | MacFarlane | H05G 2/003 250/493.1 |
| 2009/0224182 | A1* | 9/2009 | McGeoch | H05G 2/003 250/504 R |
| 2010/0019173 | A1* | 1/2010 | Someya | H05G 2/003 250/496.1 |
| 2010/0078580 | A1* | 4/2010 | Endo | H05G 2/003 250/504 R |
| 2010/0108918 | A1* | 5/2010 | Nagai | G03F 7/70033 250/504 R |
| 2010/0181498 | A1* | 7/2010 | Someya | G03F 7/70033 250/492.1 |
| 2011/0240890 | A1* | 10/2011 | Govindaraju | H05G 2/001 250/504 R |
| 2012/0313016 | A1* | 12/2012 | Fleurov | H05G 2/005 250/504 R |
| 2013/0088697 | A1* | 4/2013 | Labetski | G03F 7/70033 355/67 |
| 2014/0306115 | A1* | 10/2014 | Kuritsyn | G02B 27/0006 250/358.1 |
| 2014/0319387 | A1* | 10/2014 | Kim | H05G 2/006 250/504 R |
| 2014/0326904 | A1 | 11/2014 | Ceglio et al. | |
| 2016/0209753 | A1* | 7/2016 | Zhao | G03F 7/70033 |
| 2018/0084630 | A1* | 3/2018 | Brandstatter | H05G 2/008 |

* cited by examiner

DEVICE AND METHOD FOR GENERATING UV OR X-RAY RADIATION BY MEANS OF A PLASMA

The invention relates to a device and a method for generating UV or X-ray radiation by means of a plasma. Therein, the device according to the invention (also termed plasma radiation source) is suitable for the generation of vacuum ultraviolet (VUV, 100 nm to 300 nm wavelength), extreme ultraviolet (EUV or XUV, 10 nm to 124 nm wavelength) or soft X-ray radiation (0.2 nm to 10 nm wavelength).

Such UV or X-ray sources generate a plasma by irradiating a suitable target material example a molten metal such as tin) with an excitation light beam (for example a laser beam), wherein the atoms and/or molecules in the plasma emit electromagnetic radiation in the UV or X-ray frequency range. This radiation can be collected and used for various applications such as EUV lithography.

Managing debris includes mitigation, containment and removal of the debris.

One of the significant problems associated with plasma light sources is the degradation of sensitive surfaces and optics by plasma debris. The size range of plasma debris particles ranges from the micrometer scale, in liquid or solid phase, down to the atomic scale. Kinetic energies of debris particles range from several keV for highly energetic ions down to zero in case of certain nano particles.

In particular, debris mitigation (which comprises mitigation, containment and removal of debris particles) is important to reduce potential saturation effects during the cleaning process of optics caused by deposited target material. The efficient removal of debris and target material is of great importance to minimize downtime of devices for generating UV or X-ray radiation.

In the prior art, some methods for reducing debris in UV or X-ray light sources by means of a gas flow have been described.

For example, Documents US 2006/0226377 A1 and US 2008/0267816 A1 disclose debris mitigation systems based on gas flows which are directed transverse to the optical axis. However, debris velocities in the described device remain relatively high and not all debris particles are removed.

Furthermore, Document WO 2010/112171 A1 discloses an extreme ultraviolet light source with a gas curtain around the collector optics. However, the described gas curtain is designed for cooling the collector optics and unable to protect certain sensitive surfaces of the device.

Document WO 2014/169071 A1 discloses a system for protecting a reflective optic and/or any other surface in a plasma-based illumination system from debris by actively flowing gas against the debris flow direction. However, sensitive surfaces of the device are not protected from solidified target material and debris.

Moreover, document U.S. Pat. No. 9,476,841 B1 discloses a device for generation of UV or X-ray radiation by means of a plasma having a buffer gas inlet in a sub-chamber between an input window for an excitation light beam and a screening optical element. The described buffer gas flow does not reach the plasma generation point and is therefore not suitable for efficient debris mitigation.

Therefore, the objective of the present invention to provide a device for generating UV or X-ray radiation which is suitable for mitigating plasma debris, and which is improved in respect of the above-mentioned disadvantages of the prior art.

A first aspect of the invention relates to a device for generating UV or X-ray radiation by means of a plasma, comprising a first compartment, a dispensing device, which is adapted to provide a target material (also referred to as 'fuel material') in the first compartment, and an excitation light source, which is adapted to provide an excitation light beam (in particular also referred to as 'excitation source') in the first compartment, in particular along a direction, in order to target the target material, such that a plasma is formed by at least a part of the target material in the first compartment, and such that UV or X-ray radiation is emitted from the plasma.

The device for generating UV or X-ray radiation further comprises a buffer gas inlet and/or a buffer gas outlet for providing a buffer, gas flow (also termed 'protective gas flow') in the first compartment, wherein the buffer gas flow is provided along the direction of the excitation light beam in particular a laser beam, such that at least one debris particle generated by means of the plasma is deflected and/or the kinetic energy of the at least one debris particle is changed by means of the buffer gas flow.

Furthermore according to the present invention, the first compartment is adapted to be at least partially heated and/or cooled, in particular heated, by a heating and/or cooling device, in particular a heating device, such that at least a part of the target material inside the first compartment is heated and/or cooled, in particular heated, to facilitate target material extraction, in particular from the device for generating UV or X-ray radiation.

The target material may be any material suitable for generating a UV or X-ray emitting plasma when illuminated by the excitation light beam. Therein, the term 'plasma' describes a state of the target material, in which free (electric) charge carriers, such as ions and electrons are present.

In particular, the target material comprises or consists of a molten metal, for example tin, gallium, indium, lithium, xenon or combinations (for example mixtures) thereof.

In the context of the present specification, the term 'buffer gas' is not restricted to non-flammable or inert gases, and the buffer gas may comprise any kind of gas or gas mixture suitable to deflect debris particles generated by means of the plasma and/or change their kinetic energy.

According to certain embodiments, the buffer gas flow comprises or consists of hydrogen, helium, argon, nitrogen, neon, krypton, xenon, chlorine, fluorine, bromine, or iodine or a combination thereof.

In particular, the buffer gas flow is provided in a main propagation direction of the excitation light beam. The direction of the buffer gas flow can be achieved by the configuration of the buffer gas inlet and/or the buffer gas outlet. Alternatively or additionally, the device may comprise structures for guiding the buffer gas flow (such as the inner and outer liner).

The buffer gas flow deflects debris particles or changes mew kinetic energy, which is advantageously prevents or reduces degradation of optics and other sensitive surfaces by the debris particles. The main propagation direction of typically highly energetic debris generated by the plasma is inverse (180°) to the direction of the excitation light beam. Therefore, the buffer gas flow according to the invention is adapted to protect components of the device especially effectively, since the buffer gas flow is provided along the direction of the excitation light beam. Furthermore, both a local increase in static background gas pressure and a guided high momentum buffer gas flow are achieved by the present invention. This increases the probability of inertial collisions of plasma debris with the buffer gas, leading to a deflection of the debris and/or a reduction of their kinetic energy. Low kinetic energy particles in the nanometer scale on the other hand are suspended by the buffer gas, which is important in order to remove these residuals especially for high repetition plasma creation. The described effects prevent or reduce degradation of optics and other sensitive surfaces of the device by the debris particles, thus enhancing the lifetime and cost-of-ownership of the light source.

In other words, the device according to the invention realizes a debris mitigation system for plasma light sources utilizing confined protective gas flows. Therein, the term 'debris mitigation' includes mitigation, containment and removal of debris. In particular, the debris mitigation scheme is based on collisions of the debris with the buffer gas.

The heating device for heating the first compartment may be comprised in the device for generating UV or X-ray radiation, or may be provided separately from the device for generating UV or X-ray radiation.

Therein, the expression 'at least partially heated' means that at least a part of the first compartment is adapted to be heated by the heating device.

Furthermore, the heating device may also be adapted to cool the first compartment, in other words the heating device may be a combined heating and cooling device.

By means of the heating device, target, material and/or debris generated by the plasma can be molten or kept in the liquid state (by heating to a temperature above the melting temperature of the target material), which allows extraction from the device and prevents deposition of a solidified target material or debris layer on internal components of the device.

In certain embodiments, the device for generating UV or X-ray radiation comprises an inner liner and an outer liner, wherein the inner liner and the outer liner are convoluted structures, which are adapted to physically confine the plasma, wherein particularly the inner liner and the outer liner are adapted to maintain a continuous buffer gas flow rate around the plasma ignition point with openings for excitation source, buffer gas, light extraction, diagnostics and alignment. In particular, the inner liner and the outer liner are positioned within a vacuum chamber, wherein the vacuum chamber is configured to contain a gas or gas mixture at a pressure below 0.1 bar.

The inner liner and the outer liner are two physical embodiments for a plasma source (that is a device for generating UV or X-ray radiation by means of a plasma), wherein (by means of said device) a radiating plasma is generated inside a vacuum chamber (of the device for generating UV or X-ray radiation) by continuously irradiating droplets or a jet of a suitable target material with a focused excitation (light) source at a plasma generation point.

Advantageously, the geometric confinement of the plasma achieved by the inner and outer liner reduces the overall debris load, and debris and target material are geometrically confined. The shape of the inner liner can be optimized in order to reduce splashing of target material on solid surfaces.

Furthermore, by locally confining the buffer gas flow within the inner line (that is in the first compartment), good debris mitigation is achieved while keeping the gas pressure in the second compartment (around the inner liner) low, such that less absorption of the emitted UV or X-ray radiation by the buffer gas takes places.

Therein, particularly, the inner liner structure is temperature controlled to keep and/or transform the deposited debris and/or fuel material in/into the liquid phase to allow draining into a separate reservoir.

The inner and outer liner can be used to physically confine the plasma, guide the buffer gas flow, and control the temperature of the device according to the present invention. Thus, debris mitigation and managing of the thermal load the device is improved by the inner and outer liner.

In particular, the inner liner and/or the outer liner is/are adapted to guide the buffer gas flow.

The inner liner may comprise the buffer gas inlet and/or the buffer gas outlet.

When the device for generating UV or X-ray radiation comprises an inner liner, the first compartment of the device for generating UV or X-ray radiation is formed inside of the inner liner. Therein, in particular, the inner liner at least partially delimits the first compartment.

The outer liner is positioned around the inner liner, in particular such that a second compartment is formed between the inner liner and the outer liner.

In a further embodiment, the inner liner and the outer liner physically confine the plasma ignition point and have openings for excitation source, buffer gas, light extraction, diagnostics and alignment purposes.

In certain embodiments, the heating device is adapted to heat the inner liner. In particular, the heating device may be in direct contact with, the inner liner, such that heat is directly transferred from the heating device to the inner liner. Alternatively, the heat may be transferred indirectly from the heating device to the inner liner, for example by means of a fluid medium, which is heated by the heating device and circulates around the inner liner, thereby transferring heat to the inner liner. Therein, in particular, the heating device surrounds the inner liner, more particularly to keep the fuel material and the deposited debris in the molten (liquid) state.

According to certain embodiments of the invention, the heating device is adapted to keep and/or transform deposited debris and/or the target material in/into the liquid state. In other words, the heating device may be adapted to keep the deposited debris in the liquid state, transform the deposited debris into the liquid state, keep the target material in the liquid state, and/or transform the target material into the liquid state.

According to another embodiment of the invention, the outer liner sits at a lower temperature, in other words has a lower temperature than the inner liner, to control the temperature of the inner liner. That is, by means of the temperature difference between the inner liner and the outer liner, a heat flow from the inner liner to the outer liner is established, wherein the heat transfer rate depends on the temperature difference and hence on the temperature of the outer liner.

The inner liner and/or the outer liner may have openings for light extraction, in particular of vacuum ultraviolet, extreme ultraviolet or soft X-rays radiation, diagnostics and alignment purposes.

In particular, the device for generating UV or X-ray radiation further comprises a beam dump for at least partially absorbing the excitation light beam.

According to certain embodiments, the inner liner comprises the beam dump or the beam dump is integrated, or positioned within the inner liner and/or the outer liner to absorb at least a portion of the excitation source.

In some embodiments, the device for generating UV or X-ray radiation further comprises a cooling device (or cooling unit) which is adapted to cool the first compartment.

Particularly, the cooling unit is positioned in or at a second compartment (or in or at the second compartment, that is the above-described second compartment around the inner liner). More particularly, the cooling unit is positioned in or at an outer liner (or in or at the outer liner, that is the previously described outer liner around the inner liner) comprised in the device for generating UV or X-ray radiation, wherein the coding device is adapted to cool the first compartment.

The cooling device may be adapted to cool the first compartment directly. Alternatively, for example, the cooling device may be adapted to cool the outer liner, wherein a heat flow is established from the inner liner to the outer liner. Therein, the temperature difference between the inner liner and the outer liner can be controlled by the cooling device.

By means of the heating device and the cooling device, the temperature in the first compartment can be controlled, in particular automatically controlled, in order to provide a desired operating temperature of the device for generating UV or X-ray radiation.

In particular, the outer liner is equipped with an integrated cooling to control the temperature of the inner liner during normal operation. Therein, in particular, normal operation designates a pulsed plasma formation within the inner liner while generating UV and/or X-ray radiation.

In another embodiment, the outer liner, in which the cooling device is positioned, is arranged outside of the first compartment, particularly around the first compartment.

According to another embodiment of the invention the inner liner is actively temperature controlled with a heating and a cooling unit to define the upper and lower temperature. In particular, the heating unit can be used for start-up purposes and the cooling unit can be used for operation outside the normal operation point, for example during untriggered laser operation or laser testing.

Furthermore, the outer liner may be adapted to guide the buffer gas flow in order to increase buffer gas velocities between the inner liner and the outer liner, particularly to velocities larger than 10 m/s.

In certain embodiments, the device comprises at least one hole and/or at least one cavity, particularly positioned in the inner liner and/or the outer liner, wherein the hole and/or the cavity is particularly adapted for light extraction from the device, diagnostic and/or alignment purposes.

According to another embodiment of the invention the inner and outer liner have sealing means with respect to the excitation source delivery optics or delivery system (in other words in respect to components of the excitation light source). In particular, the sealing means have the purpose of minimizing pressure losses from the first and/or second compartment. Furthermore, in particular, the sealing means are adapted to seal the first compartment and/or the second compartment from the excitation source delivery optics and or delivery system.

In certain embodiments, the inner and outer liner have sealing means with respect to the droplet generator, in other words with respect to the droplet dispensing device. Therein, in particular, the sealing means are adapted to seal the first compartment and/or the second compartment from the droplet dispensing device.

According to another embodiment, the device comprises a fuel trap, wherein the inner liner is mechanically connected, or connected, in particular in flow connection with, the fuel trap, such that deposited debris and/or unused target material can be drained into the fuel trap. In particular, the fuel trap is adapted to contain the target material (or fuel material), more particularly in its liquid state.

In certain embodiments, the inner liner is mechanically connected to the fuel trap such that the fuel may be collected and drained to the fuel trap with and without an integrated fuel pump. In particular, an additional fuel pump is necessary in case gravity is not sufficient to drain the fuel.

According to a further embodiment of the invention, the inner liner and the outer liner have sealing means to the fuel trap. In particular, the sealing means are adapted to seal the first and/or the second compartment with respect to the fuel trap.

In a further embodiment, the device for generating UV or X-ray radiation comprises alignment system (in particular also termed positioning system) which is adapted to align, particularly actively align, and control the position of the inner liner and/or outer liner, in particular automatically. Specifically the alignment system is feed-forward controlled to compensate for thermal expansion. The alignment system may be adapted to control the relative position between the inner liner and the outer liner, in particular automatically.

In certain embodiments, the alignment system is configured to measure a value of a physical parameter of at least one component of the device for generating UV or X ray radiation, particularly along a mechanical structure of the at least one component, wherein the alignment system is configured to adjust the position of the inner liner and/or the outer liner according to the measured value. In other words, the position of the inner liner and/or outer liner is actively aligned.

In certain embodiments, the alignment system is configured to measure a temperature value of at least one component of the device for generating UV or X ray radiation, particularly along a mechanical structure of the at least one component, wherein particularly the alignment system is configured to derive, more particularly model, a thermal expansion of the at least one component from the measured temperature value, and wherein the alignment system is configured to adjust the position of the inner liner and/or the outer liner according to the measured temperature value, particularly according to the derived thermal expansion, to compensate for the thermal expansion.

In certain embodiments, the alignment system is configured to measure a light intensity value of the generated UV or X-ray radiation, particularly by means of at least one diode, wherein the alignment system is configured to adjust the position of the inner liner and/or the outer liner according to the measured light intensity value. In particular, the alignment system is configured to automatically adjust the position of the inner liner and outer liner, such that the light intensity value approaches a pre-defined value. In other words, the light intensity value can be used as a control parameter, in particular for closed-loop control.

According to another embodiment the openings of the inner and outer liner are shaped like nozzles to separate the outflow direction from the main line-of-sight of the plasma.

In particular, the pressure difference between outer liner cavity and surrounding vacuum chamber is facilitated to increase the velocity of the buffer gas through the openings. Therein, in particular, the flow direction of the buffer gas is directed by the shape of the openings. By redirecting the buffer gas flow direction away from the main line-of-sight, in particular debris may be deviated. In particular, the main line-of-sight is defined as the straight line between the theoretical point light source and any point in the vacuum chamber.

Moreover the dispensing device may be adapted to deliver the target material (in other words the fuel material) in the form of a droplet train or a jet.

According to certain embodiments, the device for generating UV or X-ray radiation comprises a vacuum chamber configured to contain a gas or gas mixture at a pressure below 0.1 bar, wherein the first compartment is positioned within the vacuum chamber.

A second aspect of the invention relates to a method for generating UV or X-ray radiation by means of a plasma, wherein a device for generating UV or X-ray radiation according to the first aspect of the invention is provided, wherein a target material is provided by the dispensing device in the first compartment, and wherein an excitation light beam is provided by the excitation light source in the first compartment along a direction, and wherein the target material is targeted by the excitation light beam, such that a plasma is formed by at least a part of the target material in the first compartment, and wherein UV or X-ray radiation is emitted from the plasma, and wherein a buffer gas flow is provided, in particular by the buffer gas inlet and/or the buffer gas outlet, in the first compartment along the direction of the excitation light beam, such that at least one debris particle generated by means of the plasma is deflected and/or the kinetic energy of the at least one debris particle is changed by means of the buffer gas flow, and wherein at least a part of the target material is heated by the heating device in theist compartment to facilitate target material extraction from the device for generating UV or X-ray radiation.

According to a further embodiment, the buffer gas flow comprises a velocity larger than 10 m/s.

According to another embodiment of the method, a pressure field in the first compartment and/or the second compartment is generated by means of the buffer gas flow, the inner liner, and the outer liner.

In particular, the pressure field within the inner and outer liner is feedback controlled. Therein, for example, the pressure field, that is the pressure at different locations in the first and second compartment, can be measured by at least one pressure sensor, and the buffer flow rate and/or the position of the inner liner and/or the position of the outer liner can be adjusted, in particular automatically. In this manner, the buffer gas flow in the device may be optimized to achieve improved debris mitigation.

In certain embodiments, a value of a physical parameter of at least one component of the device for generating UV or X ray radiation is measured, particularly along a mechanical structure of the at least one component, wherein the position of the inner liner and/or the outer liner is adjusted according to the measured value.

In certain embodiments, a temperature value of at least one component of the device for generating UV or X ray radiation is measured, particularly along a mechanical structure of the at least one component, wherein particularly a thermal expansion of the at least one component is derived, more particularly modeled, from the measured temperature value, and wherein the position of the inner liner and/or the outer liner is adjusted according to the measured temperature value, particularly according to the derived thermal expansion, to compensate for the thermal expansion.

In certain embodiments, a light intensity value of the generated UV or X-ray radiation is measured, particularly by means of at least one diode, wherein the position of the inner liner and/or the outer liner is adjusted according to the measured light intensity value. In particular the position of the inner liner and outer liner is automatically adjusted, such that the light intensity value approaches a pre-defined value. In other words, the light intensity value can be used as a control parameter, in particular for closed-loop control.

A further aspect of the invention relates to a device for generating UV or X-ray radiation, wherein the device is adapted to generate a radiating plasma inside a vacuum chamber by continuously irradiating droplets or a jet of a suitable target material with a focused excitation beam at a plasma generation point, wherein the plasma is confined by a physical embodiment, particularly an inner liner, thus maintaining a continuous buffer gas flow around the plasma generation point (also termed plasma ignition point).

In certain embodiments, the physical embodiment, particularly the inner liner, comprises openings for excitation source, buffer gas and diagnostics.

In certain embodiments, the physical embodiment, particularly the inner liner, is temperature controlled to keep and/or transform deposited debris and/or target material (and or fuel material) in/into the liquid phase to allow draining into a separate reservoir (also termed fuel trap).

In certain embodiments, a pronounced protective gas flow, in particular of hydrogen, helium, argon, nitrogen, neon, krypton, xenon, chlorine, fluorine, bromine, or iodine or a combination thereof, is created, flowing in main propagation direction of the excitation source, to inhibit degradation by debris of optics and sensitive surfaces.

In certain embodiments, the physical embodiment, particularly the inner liner, comprises openings for light extraction of vacuum ultraviolet, extreme ultraviolet or soft X-rays radiation.

In certain embodiments, the physical embodiment, particularly the inner liner, comprises openings for diagnostics and alignment purposes.

In certain embodiments, the physical embodiment, particularly the inner liner, comprises a heating device for controlling, particularly feedback controlling, a lower temperature limit of the physical embodiment.

In certain embodiment, the physical embodiment, particularly the inner liner, comprises a cooling device for controlling, particularly feedback controlling, an upper temperature limit of the physical embodiment.

In certain embodiments, the physical embodiment, particularly the inner liner, is connected to, particularly in flow connection with, the fuel trap, such that target material can be drained from the inner liner to the fuel trap, wherein particularly the target material is drained from the inner liner to the fuel trap by means of a fuel pump.

In particular, physical embodiment, particularly the inner liner, is sealed with respect to the fuel trap.

According to a further embodiment, the inner liner is encompassed by an outer liner, wherein the temperature of the outer liner is higher than the temperature of the inner liner (in other words wherein the outer liner sits at lower temperature), such that the temperature of the inner liner is controlled by the temperature of the outer liner. In other words, due to the temperature difference between the inner liner and the outer liner, a heat flow is established from the inner liner to the outer liner. Thereby, the inner liner is cooled, wherein the rate of cooling depends on the temperature difference between the inner liner and the outer liner.

In certain embodiments, the outer liner comprises openings for light extraction of vacuum ultraviolet, extreme ultraviolet or soft X-rays radiation.

In certain embodiments, the outer liner comprises openings for diagnostics and alignment.

In certain embodiments, the inner liner and the outer liner comprise equivalent openings (in other words aligned or at least partially overlapping openings). These equivalent openings can be used for radiation collection, diagnostics and alignment purposes.

In certain embodiments, the outer liner comprises an integrated cooling.

In certain embodiments, the outer liner is sealed with respect to the fuel trap.

In certain embodiments, the device comprises an integrated alignment system to allow position control of inner and outer liner during operation.

In certain embodiments, the device comprises sealing means with respect to the excitation source delivery system or with respect to the excitation light source.

In certain embodiments, the device comprises a sealing means or sealing function with respect to the droplet generator or with respect to the droplet dispensing device.

In certain embodiments, the device comprises a feedback controlled pressure field.

In certain embodiments, the device comprises a beam dump being capable of damping a least a portion of the excitation source without imposing a shadow onto the collected and focused radiation beam.

In certain embodiments, the openings are shaped like nozzles to separate the outflow direction from the main line-of-sight to the plasma.

The present invention is now to be explained more closely by means of different embodiments and with reference to the attached drawings.

Figure 2:
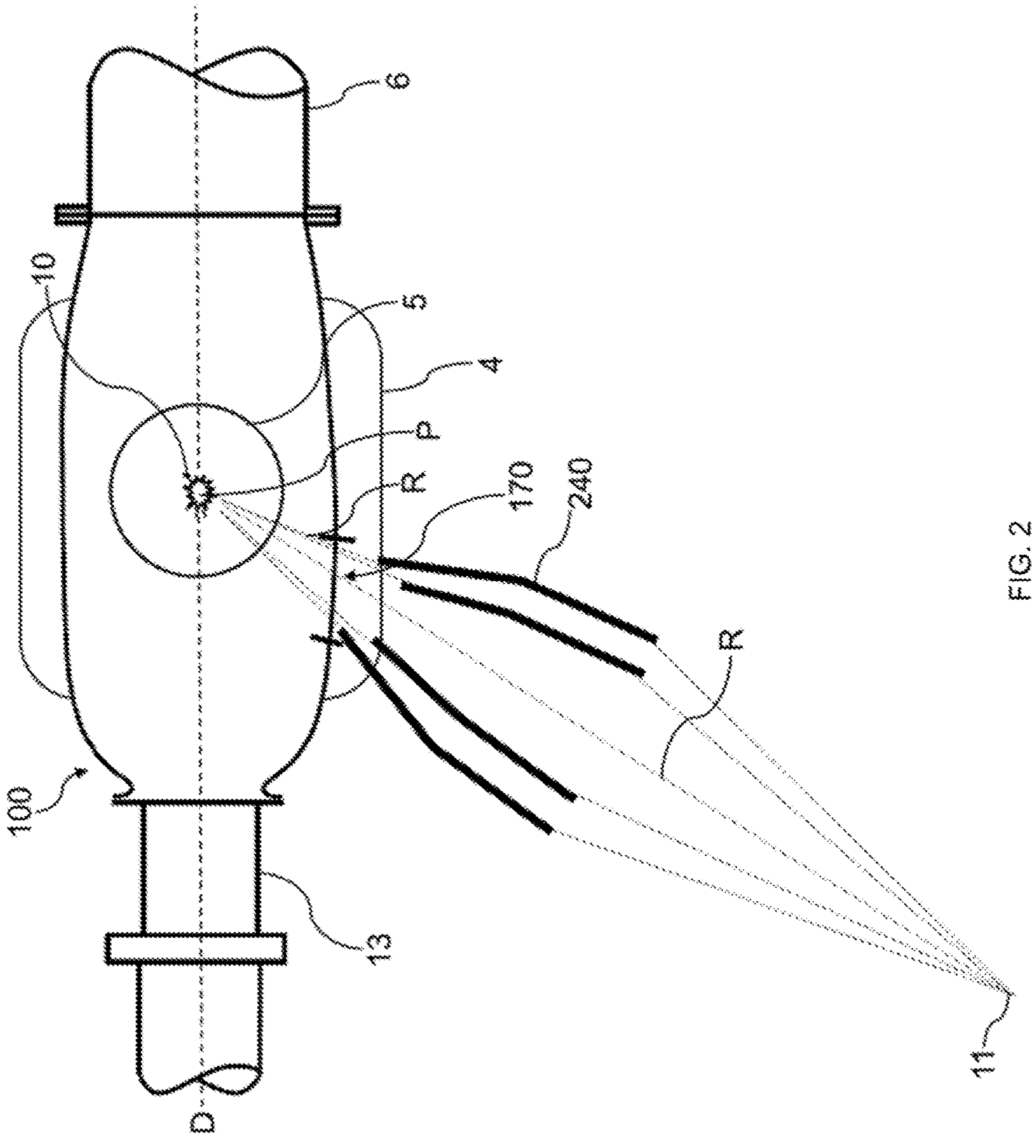
Figure 3:
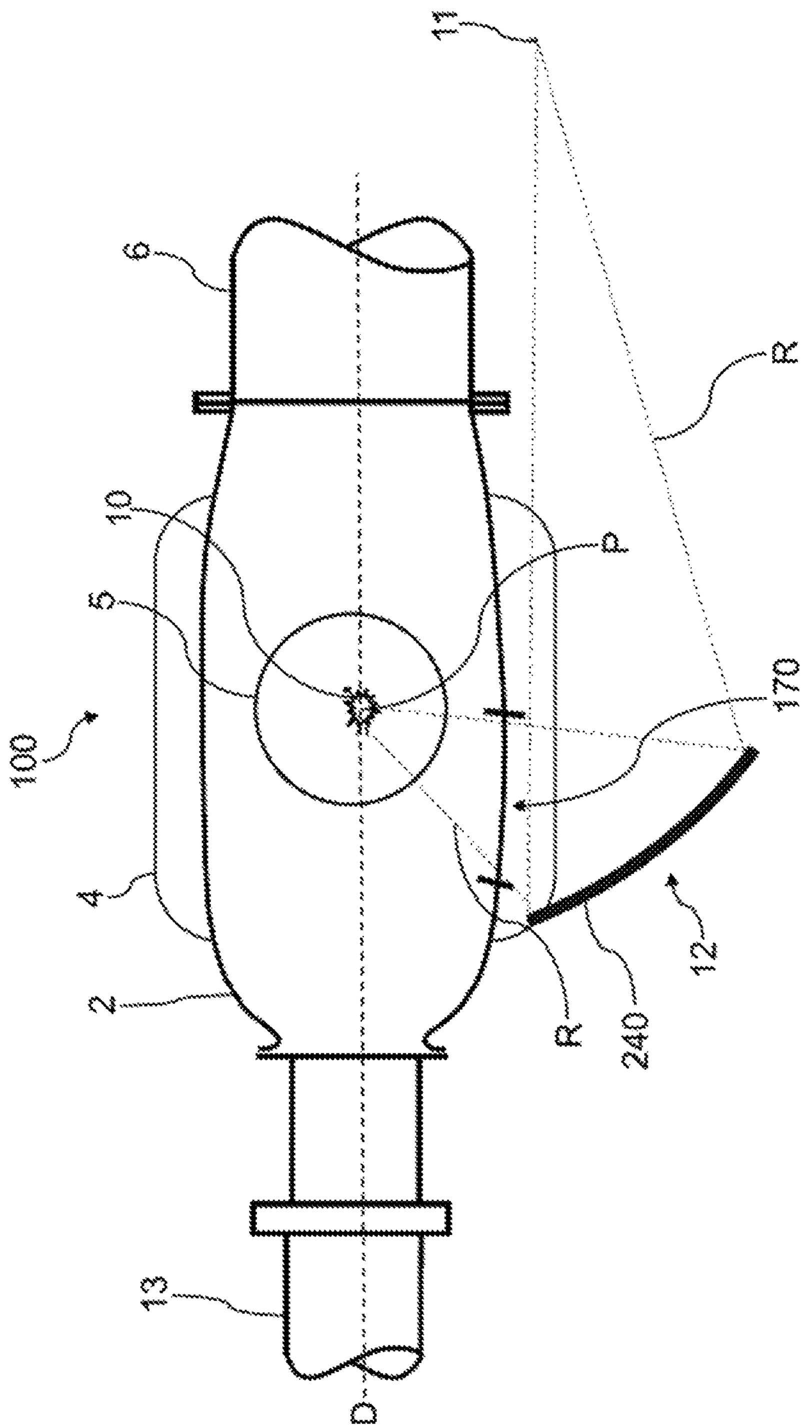

FIG. 1 shows a simplified sectional side view through the light source, including the general aspects of the present invention schematically, FIG. 2 shows a simplified top view of the light source in one embodiment, FIG. 3 shows a simplified top view of the light source in a further embodiment.

FIG. 1 shows a sectional side view through a device 100 for generating UV or X-ray radiation R (also termed 'light source') according to the invention. An excitation light beam 90, for example a laser beam, which is also termed 'excitation source 9', is generated by a excitation light source 13, for example a laser source, focused by an excitation delivery system 7 (for example a lens), and propagates in a direction D to a first compartment 110 within a vacuum chamber 190 of the device 100 for generating UV or X-ray radiation R, wherein the vacuum chamber 190 is configured to contain a gas or gas mixture at a pressure below 0.1 bar.

The device 100 further comprises a droplet dispensing device 5 for providing a droplet train 8 or jet 8 of a target material 80 (also termed 'fuel material') in the first compartment 110. Furthermore, the device 100 may comprise a droplet positioning system 250 which is adapted to adjust the direction of the droplet train 8 or jet 8.

The focused excitation light beam 90 interacts with the target material 80 at a plasma generation site P in the first compartment 110 of the device 10, particularly at the center of the first compartment 110, to create a plasma 10, wherein the plasma 10 radiates in the region of vacuum ultraviolet, extreme ultraviolet or soft X-ray, in other words the plasma 10 emits electromagnetic radiation in the frequency range of ultraviolet light or X-rays.

Therein, the path of the excitation light beam 90 intersects with the droplet train 8 or jet 8 at the plasma generation site P, such that the excitation light beam 90 is directed at a droplet of target material 80 when the respective droplet is positioned at the plasma generation site P. In turn, the atoms and/or molecules contained in the target material 80 of the respective droplet are excited by the excitation light beam 90 and form a plasma 10. Therein, in particular, the term 'excite' describes ionization and/or electron transfer of the atoms and/or molecules in the target material 80 induced by the excitation light beam 90, and the term 'plasma' describes a state of the target material 80, in which free (electric) charge carriers, such as ions and electrons are present.

In particular, the target material 80 comprises or consists of tin, gallium, indium lithium, xenon or combinations (for example mixtures) thereof in the liquid state.

The created plasma 10 is enclosed by two convoluted structures, namely the inner liner 1 and the outer liner 2 of the device 100, which are positioned within the vacuum chamber 190. The inner liner 1 represents the high temperature core of the device 100 for generating UV or X-ray radiation R. In particular, the temperature of the inner liner 1 is controlled, more particularly feedback controlled, by means of a heating device 150 to be able to keep the deposited target material 80 (that is the target material 80 deposited into the first compartment 110 of the device 100) in the molten (liquid) state. The inner liner 1 is connected to, particularly in flow connection with, a heated fuel trap 4 (a reservoir for containing the target material) to be able to drain and/or recycle the deposited target material 80 in the liquid state. The outer liner 2, which is particularly actively cooled by a cooling device 160, encloses the inner liner 1 and is particularly utilized to control the temperature of the inner liner 1 during normal operation conditions.

The first compartment 110 of the device is formed inside of the inner liner 1, in particular delimited by the walls of the inner liner 1, and a second compartment 120 is formed around the inner liner 1, between the inner liner 1 and the outer liner 2.

The inner liner 1 has two main openings, which are each arranged in a plane which is perpendicular to the direction D of the excitation light beam 90. A first opening is used as a buffer gas inlet 130 for the buffer gas flow B. In addition, the excitation light beam 90 enters the first compartment 110 through the first opening 130. A second opening serves as a gas outlet 140 and outlet for the excitation light beam 90.

A pronounced buffer gas flow B (illustrated by arrows in FIG. 1) which particularly comprises or consists of hydrogen, helium, argon, nitrogen, neon, krypton, xenon, chlorine, fluorine, bromine or iodine, is created by a buffer gas source 210 which is in flow connection with the vacuum chamber 190.

The buffer gas flow B is confined by the inner liner 1 thus maintaining a continuous flow rate. In particular, the buffer gas source 210 is realized as a plurality of nozzles arranged in a circumferential direction around, the excitation delivery system 7. Furthermore, in particular, a buffer gas sink 220 is created by a vacuum system, particularly a vacuum pump, that is connected (in flow connection) to a vacuum inlet 6.

In particular, the vacuum inlet 6 is approximately in an in-line position, in other words the center of the vacuum inlet 6 coincides with the center of the excitation light beam 90. The described arrangement of the buffer gas source 210, inner liner 1, vacuum inlet 6 and buffer gas sink 220 induces a buffer gas flow B which entrains and deflects debris particles generated at the plasma generation site P where the excitation light beam 90 interacts with the target material 80.

Besides the first and second openings 130, 140 the inner liner 1 and the outer liner 2 may comprise further openings or holes 170 for light extraction of vacuum ultraviolet, extreme ultraviolet or soft X-rays radiation from the device 100, and/or holes for diagnostics and alignment purposes. Therein the term 'diagnostic and alignment purposes' describes controlling and maintaining the function of the device 100, wherein the function is particularly generating UV or X-ray radiation R in the desired frequency range and at the desired intensity. For example, the holes 170 for diagnostic and alignment purposes may be used to observe and adjust the position of the excitation light beam 90 and/or the position of the inner liner 1, particularly in respect to the outer liner 2.

The outer liner 2, enclosing the inner liner 1, represents an outer flow guiding surface and therefore shapes the buffer gas flow B around the inner liner 1. In particular, the outer liner 2 has integrated cooling channels, wherein more particularly the temperature of the outer liner 2 is feedback controlled.

In particular, the inner liner 1 and/or the outer liner 2, more particularly both the inner liner 1 and the outer liner 2, comprise or are equipped with a pressure sensor 30 for controlling the pressure field generated in the first compartment 110 and the second compartment 120 by means of the buffer gas flow B, wherein particularly the pressure field in the first compartment 110 and/or in the second compartment 120 can be feedback controlled by means of the pressure sensor 230.

In particular, as a mechanical part, the outer liner 2 is adapted to mechanically connect a collector unit comprising collectors 240 (see FIG. 2 and FIG. 3), the vacuum inlet 6, the fuel trap 4, the beam delivery optics (in particular the excitation light source 13 and the excitation delivery system 7), the alignment system 180, and the droplet dispensing device 5.

In order to minimize pressure losses, the device 100 particularly comprises sealing means between the outer liner 2 and the vacuum inlet 6, the outer liner 2 and the fuel trap 4, the outer liner 2 and the droplet dispensing device 6, the outer liner 2 and the beam delivery optics (such as the excitation light source 13 and the excitation delivery system 7), the outer liner 2 and the alignment system 180, and/or between the outer liner 2 and the droplet positioning system 250.

In particular, the inner liner 1 is positioned on top of the fuel trap 4. Therefore the inner liner 1 may comprise sealing means with respect to the fuel trap 4.

Both, the inner and outer liner 2 are subject to thermal growth. Therefore, the two structures are equipped with an alignment system 180 (also termed 'positioning system') for controlling the position of the inner liner 1 and/or the relative position of the inner liner 1 and the outer liner 2 during operation of the device 100, wherein particularly the alignment system 180 is feed-forward controlled.

In particular, the holes 170 or openings for light extraction, diagnostics and alignment purposes in inner liner 1 and/or the outer liner 2 are shaped like nozzles to separate the outflow direction from the main line-of-sight to the plasma 10.

Not radiated target, material 80 (in other words target material 80 which has not interacted with the excitation light beam 90) is captured and drained to a separate reservoir called fuel trap 4 comprised in the device 100, wherein particularly the fuel trap 4 is actively heated by a heating and/or cooling system 200. The draining of the target material 80 may be achieved by means of a pump or by means of gravity, wherein for example the fuel trap 4 is positioned below the first compartment 110 of the device 100.

At least part of the excitation light beam 90 is dumped in a beam dump 3. That is, at least a part of the excitation light beam 90 is absorbed by the beam dump 3 to avoid damage to components of the device 100.

FIG. 2 and FIG. 3 show simplified top views of the device 100, wherein the device 100 is viewed along a line of sight from the droplet dispensing device 5 to the fuel trap 4, in other word rotated 90° around the direction D compared to FIG. 1.

The devices shown in FIG. 2 and FIG. 3 comprise collectors 240 for collecting and/or focusing the UV or X-ray radiation R generated by the device 100, in particular comprising a mirror or a plurality of mirrors.

In the embodiment shown in FIG. 2, the collectors 240 are arranged according to a grazing incidence collector setup having an intermediate focus 11. Grazing incidence collectors rely on small incidence angles, in particular in order to reflect soft-X-ray radiation, and use single mirror surfaces. Typically, nested arrangements are used to increase the power output.

In addition, FIG. 2 shows a hole 170 for extracting the UV or X-ray radiation R generated by the plasma 10 at the plasma generation site P from the first compartment 110 (see FIG. 1) of the device 100.

In the embodiment depicted in FIG. 3, the collectors 240 for collecting and/or focusing the UV or X-ray radiation R are arranged according to a normal incidence collector setup 12 having an intermediate focus 11. Normal incidence collectors typically work with near normal incidence angles. To increase the soft-X-ray reflectivity, periodic multi-layer structures are typically utilized in normal incidence collector setups.

The devices 100 shown in FIG. 2 and FIG. 3 may comprise any of the features described above for the device 100 shown in FIG. 1.

In particular, in the devices 100 shown in FIG. 2 and FIG. 3, the inner finer 1 and outer liner 2 are surrounded by a vacuum chamber 190 (compare FIG. 1), which is not depicted in FIG. 2 and FIG. 3.

| List of reference signs | |
|---|---|
| 1 | Inner liner |
| 2 | Outer liner |
| 3 | Beam dump |
| 4 | Fuel trap |
| 5 | Dispensing device |
| 6 | Vacuum Inlet |
| 7 | Excitation delivery system |
| 8 | Droplet train or jet |
| 10 | Plasma |
| 11 | Intermediate focus |
| 12 | Normal incidence collector setup |
| 13 | Excitation light source |
| 80 | Target material |
| 90 | Excitation light beam |
| 100 | Device for generating UV or X-ray radiation |
| 110 | First compartment |
| 120 | Second compartment |
| 130 | First opening, buffer gas inlet |
| 140 | Buffer gas outlet |
| 150 | Heating device |
| 160 | Cooling device |
| 170 | Hole or cavity |
| 180 | Alignment system |
| 190 | Vacuum chamber |
| 200 | Heating and/or cooling system |
| 210 | Buffer gas source |
| 220 | Buffer gas sink |
| 230 | Pressure sensor |
| 240 | Collector |
| 250 | Droplet positioning system |
| B | Buffer gas flow |
| D | Direction |

-continued

| List of reference signs | |
|---|---|
| P | Plasma generation site |
| R | UV or X-ray radiation |

The invention claimed is:

1. Device (100) for generating UV or X-ray radiation (R) by means of a plasma (10), comprising a first compartment (110), a dispensing device (5), which is adapted to provide a target material (80) in the first compartment (110), an excitation light source (13), which is adapted to provide an excitation light beam (90) in the first compartment (110) along a direction (D) in order to target the target material (80), such that a plasma (10) is formed by at least a part of the target material (80) in the first compartment (110), and such that UV or X-ray radiation (R) is emitted from the plasma (10), characterized in that the device (100) for generating UV or X-ray radiation (R) further comprises a buffer gas inlet (130) and/or a buffer gas outlet (140) for providing a buffer gas flow (B) in the first compartment (110), wherein the buffer gas flow (B) is provided along the direction (D) of the excitation light beam (90), such that at least one debris particle generated by means of the plasma (10) is deflected and/or the kinetic energy of the at least one debris particle is changed by means of the buffer gas flow (B), and wherein the first compartment (110) is adapted to be at least partially heated by a heating device (150), such that at least a part of the target material (80) inside the first compartment (110) is heated to facilitate target material (80) extraction from the device (100) for generating UV or X-ray radiation (R).

2. Device (100) for generating UV or X-ray radiation (R) according to claim 1, characterized in that the device (100) comprises an inner liner (1) and an outer liner (2), wherein the inner liner (1) and the outer liner (2) are convoluted structures, which are adapted to physically confine the plasma (10), wherein particularly the inner liner (1) and the outer liner (2) are positioned within a vacuum chamber (190), wherein the vacuum chamber (190) is configured to contain a gas or gas mixture at a pressure below 0.1 bar.

3. Device (100) for generating UV or X-ray radiation (R) according to claim 2, characterized in that said heating device (150) is adapted to heat said inner liner (1).

4. Device (100) for generating UV or X-ray radiation (R) according to claim 2, characterized in that the outer liner (2) is arranged outside of the first compartment (110), particularly around the first compartment (110).

5. Device (100) for generating UV or X-ray radiation (R) according to claim 2, characterized in that the outer liner (2) is adapted to guide the buffer gas flow (B) in order to increase buffer gas velocities between the inner liner (1) and the outer liner (2), particularly to velocities larger than 10 m/s.

6. Device (100) for generating UV or X-ray radiation (R) according to claim 2, characterized in that the device (100) comprises a fuel trap (4), wherein the inner liner (1) is connected to the fuel trap (4), such that deposited debris and/or unused target material (80) can be drained into the fuel trap (4).

7. Device (100) for generating UV or X-ray radiation (R) according to claim 2, characterized in that the device (100) for generating UV or X-ray radiation (R) comprises an alignment system (180) which is adapted to align, particularly actively align, and control the position of the inner liner (1) and outer liner (2).

8. Device (100) for generating UV or X-ray radiation (R) according to claim 1, characterized in that said heating device (150) is adapted to keep and/or transform deposited debris and/or the target material (80) in/into the liquid state.

9. Device (100) for generating UV or X-ray radiation (R) according claim 1 characterized in that the device (100) for generating UV or X-ray radiation (R) further comprises a cooling device (160), wherein the cooling device (160) is adapted to cool the first compartment (110).

10. Device (100) for generating UV or X-ray radiation (R) according to claim 9, characterized in that said cooling device (160) is positioned in or at a second compartment (120), wherein particularly the cooling device (160) is positioned in or at an outer liner (2) comprised in the device (100) for generating UV or X-ray radiation (R).

11. Device (100) for generating UV or X-ray radiation (R) according to claim 1, characterized in that the device (100) comprises at least one hole (170) and/or at least one cavity, particularly positioned in the inner liner (1) and/or the outer liner (2), wherein the hole (170) and/or the cavity is particularly adapted for light extraction from the device (100), diagnostic and/or alignment purposes.

12. Device (100) for generating UV or X-ray radiation (R) according to claim 1, characterized in that the dispensing device (5) is adapted to deliver the target material (80) in the form of a droplet train or a jet (8).

13. Device (100) for generating UV or X-ray radiation (R) according to claim 1, characterized in that the device (100) for generating UV or X-ray radiation (R) comprises a vacuum chamber (190) for generating the plasma (10).

14. Method for generating UV or X-ray radiation (P) by means of a plasma (10), wherein a device (100) for generating UV or X-ray radiation (R) according to claim 1 is provided, and wherein a target material (80) is provided by the dispensing device (5) in the first compartment (110), and wherein an excitation light beam (90) is provided by the excitation light source (13) in the first compartment (110) along a direction (D), and wherein the target material (80) is targeted by the excitation light beam (90), such that a plasma (10) is formed by at least a part of the target material (80) in the first compartment (110), and wherein UV or X-ray radiation (R) is emitted from the plasma (10), and wherein a buffer gas flow (B) is provided in the first compartment (110) along, the direction (D) of the excitation light beam (90), such that at least one debris particle generated by means of the plasma (10) is deflected and/or the kinetic energy of the at least one debris particle is changed by means of the buffer gas flow (B), and wherein at least a part of the target material (80) is heated by the heating device (150) in the first compartment (110) to facilitate target material (80) extraction from the device (100) for generating UV or X-ray radiation (R).

15. Method for generating UV or X-ray radiation (R) according to claim 14, wherein the buffer gas flow (B) comprises a velocity larger than 10 m/s.

* * * * *